(12) United States Patent
Iwazaki et al.

(10) Patent No.: US 11,956,926 B2
(45) Date of Patent: Apr. 9, 2024

(54) OUTDOOR UNIT

(71) Applicant: Mitsubishi Electric Corporation, Tokyo (JP)

(72) Inventors: Kenji Iwazaki, Tokyo (JP); Koichi Arisawa, Tokyo (JP); Takashi Yamakawa, Tokyo (JP); Takuya Shimomugi, Tokyo (JP); Keisuke Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 922 days.

(21) Appl. No.: 16/961,338

(22) PCT Filed: Mar. 12, 2018

(86) PCT No.: PCT/JP2018/009548
§ 371 (c)(1),
(2) Date: Jul. 10, 2020

(87) PCT Pub. No.: WO2019/175939
PCT Pub. Date: Sep. 19, 2019

(65) Prior Publication Data
US 2020/0375062 A1   Nov. 26, 2020

(51) Int. Cl.
*H05K 7/20* (2006.01)
*F24F 11/88* (2018.01)

(52) U.S. Cl.
CPC ............ *H05K 7/2039* (2013.01); *F24F 11/88* (2018.01); *H05K 7/20145* (2013.01)

(58) Field of Classification Search
CPC .... H05K 7/20; H05K 7/20145; H05K 7/2039; H05K 1/0203; F24F 11/88; F24F 1/46;
(Continued)

(56) References Cited

U.S. PATENT DOCUMENTS

2010/0193164 A1* 8/2010 Wakatsuki ............... F24F 1/24
165/121
2013/0255298 A1* 10/2013 Amano ................... F24F 1/24
62/186

FOREIGN PATENT DOCUMENTS

CN    107477770 A    12/2017
EP    2 241 830 A2   10/2010
(Continued)

OTHER PUBLICATIONS

Office Action dated Sep. 17, 2021 issued in the corresponding CN application No. 201880090710.4 ( and English machine translation).

(Continued)

*Primary Examiner* — Harry E Arant
(74) *Attorney, Agent, or Firm* — POSZ LAW GROUP, PLC

(57) ABSTRACT

An outdoor unit includes a housing having a front surface formed with an outlet and a back surface facing the front surface, an airflow flowing through the outlet; a substrate horizontally placed in the housing, an electric component being mounted on the substrate; and a heat dissipator including a plurality of fins, each of the fins having a heat dissipation surface, the heat dissipator dissipating, due to the airflow, heat generated by the electric component. The heat dissipation surface of each of the fins is parallel to the back surface or is angled at greater than 0 degrees and less than 90 degrees relative to the back surface in top view.

6 Claims, 6 Drawing Sheets

(58) Field of Classification Search
CPC ....... F24F 1/20; F24F 1/24; F24F 1/48; F25B 49/02; F25B 31/006
See application file for complete search history.

(56) References Cited

FOREIGN PATENT DOCUMENTS

| | | | |
|---|---|---|---|
| JP | S61-120002 U | | 7/1986 |
| JP | H10-026372 A | | 1/1998 |
| JP | H11-063573 A | | 3/1999 |
| JP | 2003-065563 A | | 3/2003 |
| JP | 2010-144989 A | | 7/2010 |
| JP | 2010144989 A | * | 7/2010 |
| JP | 2010-236781 A | | 10/2010 |
| JP | 2013-137132 A | | 7/2013 |
| JP | 2013-204935 A | | 10/2013 |
| JP | 2015-048990 A | | 3/2015 |

OTHER PUBLICATIONS

Office Action dated Sep. 27, 2021 issued in the corresponding IN application No. 202027031574.
International Search Report of the International Searching Authority dated May 15, 2018 for the corresponding International application No. PCT/JP2018/009548 (and English translation).
Office Action dated May 25, 2021, issued in corresponding JP Patent Application No. 2020-505575 (and English Machine Translation).
Office Action dated Apr. 13, 2022 issued in a corresponding Chinese Patent Application No. 201880090710.4 (and English machine translation).
Office Action dated Apr. 19, 2021, issued in corresponding CN Patent Application No. 201880090710.4 (and English Machine Translation).

* cited by examiner

OUTDOOR UNIT

CROSS REFERENCE TO RELATED APPLICATION

This application is a U.S. national stage application of PCT/JP2018/009548 filed on Mar. 12, 2018, the contents of which are incorporated herein by reference.

FIELD

The present invention relates to an outdoor unit of an air conditioner.

BACKGROUND

In a housing constituting the outer casing of an outdoor unit, a blower that generates an airflow and a compressor that compresses refrigerant are provided. In the housing, a partition plate is provided to partition the interior into a blower chamber in which the blower is placed and a compressor chamber in which the compressor is placed. On the substrate on which an electric component that drives the compressor is mounted, a heat dissipator is provided to dissipate heat generated by the electric component when this electric component drives the compressor in order to reduce operation failures of the electric component due to the influence of heat.

A heat sink serving as the heat dissipator includes a base that receives heat generated by the electric component, and a plurality of fins provided on the base and spaced apart from each other. The heat sink is provided in such a manner that the fins protrude toward the blower chamber. Due to this configuration, the heat sink dissipates heat through heat exchange between heat dissipation surfaces of the fins and an airflow flowing through the blower chamber. Patent Literature 1 discloses an outdoor unit provided with a heat sink in an opening in a partition plate such that it is possible to dissipate heat of electric components constituting a power-supply stabilizer circuit. In the outdoor unit disclosed in Patent Literature 1, the electric components are mounted on a substrate vertically placed. A plurality of fins are provided on the vertical plane of a rectangular base and extend in the horizontal direction. In the heat sink, the fins having a length equal to the longer side of the base are placed parallel to the longer side. Alternatively, in the heat sink, the fins having a length greater than the longer side of the base are placed to be angled relative to the longer side.

CITATION LIST

Patent Literature

Patent Literature 1: Japanese Patent Application Laid-open No. H11-63573

SUMMARY

Technical Problem

In an outdoor unit, electric components may be mounted on a substrate horizontally placed, instead of the substrate vertically placed. In the outdoor unit in which electric components are mounted on the substrate horizontally placed, a plurality of fins of a heat sink are provided on a base horizontally placed in the same manner as the substrate and extend in the vertical direction. Along with an airflow, foreign matters such as dust or sand possibly may enter the housing. Accordingly, the fins provided to extend in the vertical direction make it possible to reduce the accumulation amount of foreign matters on the heat dissipation surfaces of the fins as compared to the case where the fins are provided to extend in the horizontal direction. Due to this configuration, the outdoor unit, in which the electric components are mounted on the substrate horizontally placed, can reduce a reduction in heat dissipation efficiency caused by the accumulation of foreign matters on the fins.

When the heat sink according to the conventional technique described above is provided in an outdoor unit in which electric components are mounted on a substrate horizontally placed, the orientation of the fins is significantly different from the direction of airflow entering the heat sink and this may reduce the amount of airflow passing through the space between the fins. Thus, in the conventional technique, there is a problem in that an insufficient amount of airflow passing through the space between the fins may reduce the heat dissipation efficiency of the electric components.

The present invention has been made in view of the above problems, and an object of the present invention is to provide an outdoor unit that can achieve improvement in heat dissipation efficiency for heat generated by an electric component provided in a housing.

Solution to Problem

To solve the above problems and to achieve the object, an outdoor unit according to an aspect of the present invention includes: a housing having a front surface formed with an outlet and a back surface facing the front surface, an airflow flowing through the outlet; a substrate horizontally placed in the housing, an electric component being mounted on the substrate; and a heat dissipator comprising a plurality of fins, each of the fins having a heat dissipation surface, the heat dissipator dissipating, due to the airflow, heat generated by the electric component. The heat dissipation surface of each of the fins is parallel to the back surface or is angled at greater than 0 degrees and less than 90 degrees relative to the back surface in top view.

Advantageous Effects of Invention

The outdoor unit according to the present invention has an effect where it is possible to achieve improvement in heat dissipation efficiency for heat generated by an electric component provided in a housing.

DESCRIPTION OF EMBODIMENTS

An outdoor unit according to embodiments of the present invention will be described in detail below with reference to the accompanying drawings. The present invention is not limited to the embodiments.

First Embodiment

Figure 1:
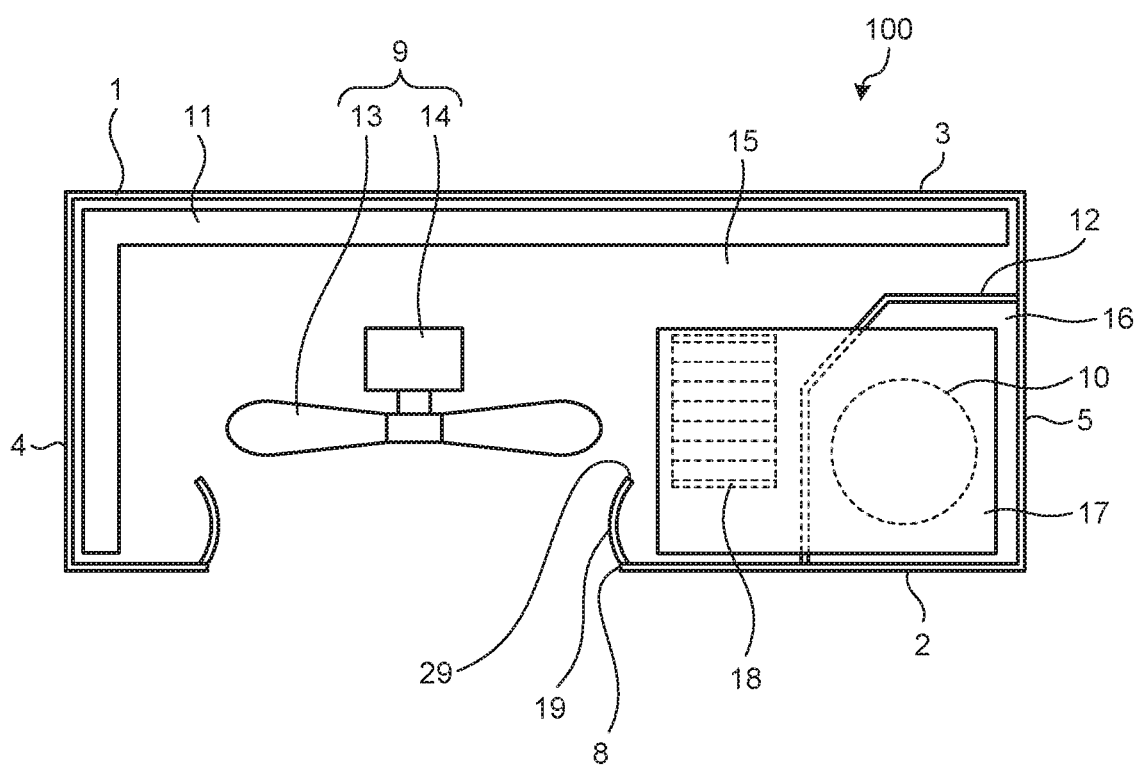
FIG. 1 is a diagram illustrating a configuration of an outdoor unit according to a first embodiment of the present invention.
Figure 2:
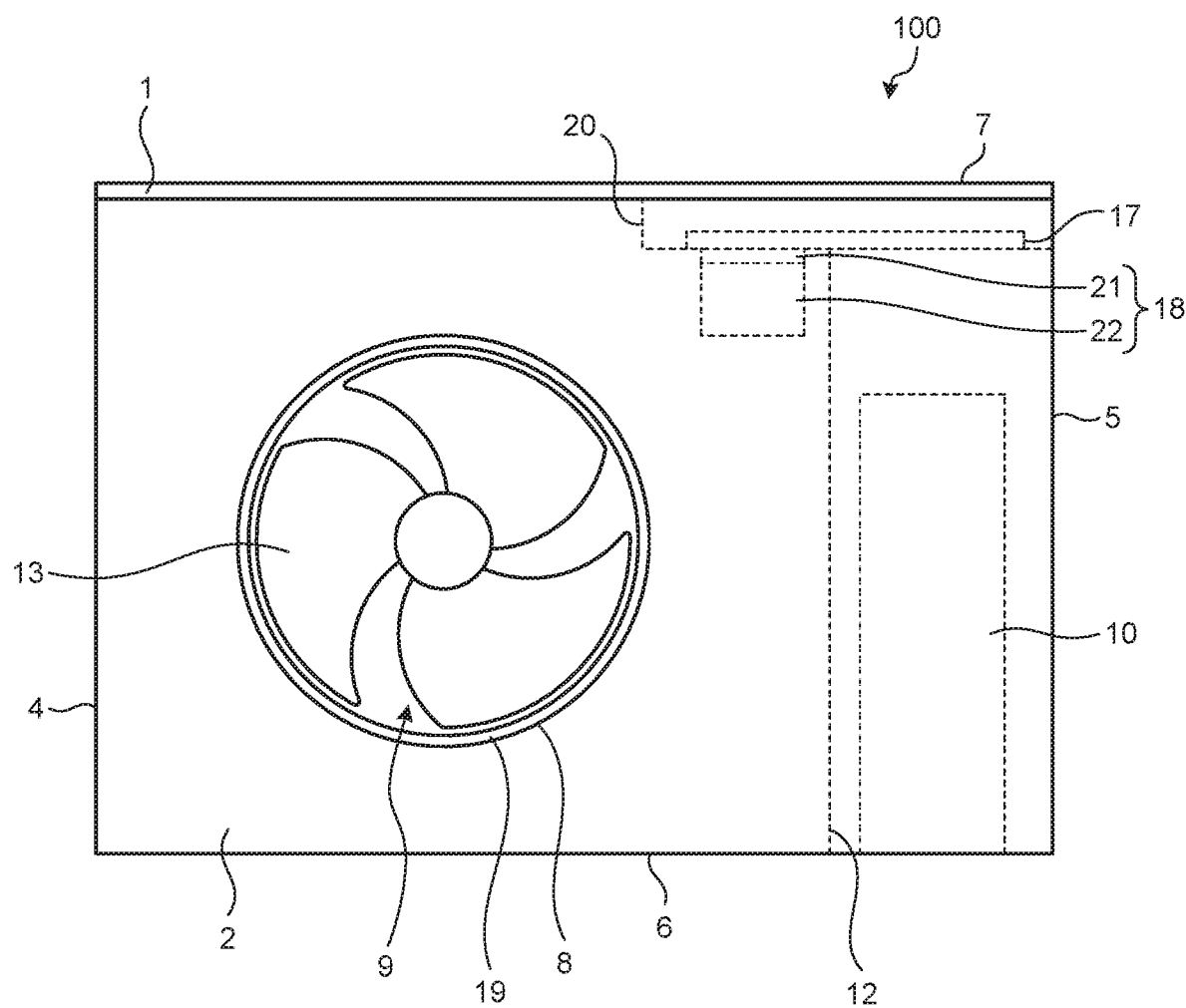
FIG. 2 is a front view of the outdoor unit illustrated in FIG. 1.

FIG. 1 is a diagram illustrating a configuration of an outdoor unit 100 according to a first embodiment of the present invention. FIG. 2 is a front view of the outdoor unit 100 illustrated in FIG. 1. The outdoor unit 100 is an outdoor unit intended for an air conditioner and is placed outdoors. The air conditioner uses refrigerant circulating between the outdoor unit 100 and an indoor unit placed indoors to transfer heat between indoor air and outdoor air in order to perform air conditioning in a room. FIG. 1 schematically illustrates an internal configuration of the outdoor unit 100 when the outdoor unit 100 is viewed from the top.

The outdoor unit 100 includes a housing 1 constituting the outer casing of the outdoor unit 100. The housing 1 is a box member having six surfaces including a front surface 2 formed with an outlet 8 through which an airflow flows, a back surface 3 facing the front surface 2, two side surfaces 4 and 5, a bottom surface 6, and a top surface 7. In the first embodiment, a direction in which the outlet 8 is directed is sometimes referred to as "front" in the outdoor unit 100, while a direction opposite to the front is sometimes referred to as "rear" in the outdoor unit 100. The front and the rear are sometimes referred collectively to as "front-rear direction". The leftward direction and the rightward direction when the outdoor unit 100 is viewed from the front are sometimes referred to as "right-left direction". The side surface 4 is the left-side surface when the outdoor unit 100 is viewed from the front. The side surface 5 is the right-side surface when the outdoor unit 100 is viewed from the front.

The outdoor unit 100 includes a blower 9 provided in the housing 1 to move air drawn from outside of the housing 1 to the outlet 8. The blower 9 is positioned at the rear of the outlet 8. The blower 9 includes an impeller 13 and a fan motor 14 that is a power source of the impeller 13. The impeller 13 rotates by driving of the fan motor 14 and generates an airflow.

The outdoor unit 100 includes a compressor 10 and a heat exchanger 11 that are provided in the housing 1. The compressor 10 compresses refrigerant. The compressor 10 is placed rightward of the outlet 8 and the blower 9, that is, at a position closer to the side surface 5 than the outlet 8 and the blower 9. The heat exchanger 11 exchanges heat between refrigerant and air. The heat exchanger 11 is provided along the back surface 3 and the side surface 4. A partition plate 12 is provided on the bottom surface 6 in the housing 1. The partition plate 12 partitions the interior of the housing 1 into a blower chamber 15 in which the blower 9 and the heat exchanger 11 are accommodated, and a compressor chamber 16 in which the compressor 10 is accommodated. The partition plate 12 illustrated in FIG. 1 has a shape formed of a combination of flat surfaces. The compressor chamber 16 is positioned rightward of the blower 9. It is allowable that the partition plate 12 has a shape including a curved surface. In the internal configuration illustrated in FIG. 1, the periphery around the compressor 10 is surrounded by the housing 1 and the partition plate 12.

The outdoor unit 100 includes a substrate 17 having electric components mounted thereon, and a heat dissipator 18 that dissipates heat generated by the electric component. The substrate 17 is provided substantially horizontally in the outdoor unit 100. On the substrate 17, an electric component that drives the compressor 10 and an electric component that drives the blower 9 are mounted. The substrate 17 and the electric components are accommodated in an electric component box 20. The electric component box 20 is placed rightward of a rear end 29 of a bell mouth 19. The partition plate 12 partitions the interior of the housing 1 into the blower chamber 15 and the compressor chamber 16 between the bottom surface 6 and the top surface 7 at the rear of the electric component box 20. The partition plate 12 partitions the interior of the housing 1 into the blower chamber 15 and the compressor chamber 16 between the bottom surface 6 and the electric component box 20 under the electric component box 20. The compressor 10 is placed at a position below the electric component box 20 in the compressor chamber 16. FIGS. 1 and 2 omit illustrations of the electric components. FIG. 1 omits illustrations of the electric component box 20.

As illustrated in FIG. 2, the outlet 8 has a round shape in the front surface 2. The bell mouth 19 is provided such that it protrudes from the peripheral edge of the outlet 8 into the interior of the housing 1. The rear end 29 of the bell mouth 19 is an end portion of the bell mouth 19 protruding into the interior of the housing 1. The rear end 29 is an end of the bell mouth 19 opposite to the outlet 8. The back surface 3 and the side surface 4 are each provided with an opening through which outside air is drawn into the housing 1. Air is drawn into the housing 1 through the openings in the back surface 3 and the side surface 4 from outside of the housing 1, then undergoes heat exchange in the heat exchanger 11, and then flows toward the outlet 8. The partition plate 12 is provided such that the blower chamber 15 is extended to the rear of the electric component box 20. Accordingly, the outdoor unit 100 can move an airflow, having passed through the heat exchanger 11 at the rear of the electric component box 20, toward the outlet 8. FIGS. 1 and 2 omit illustrations of the openings provided in the back surface 3 and the side surface 4.

The heat dissipator 18 is a heat sink including a plurality of fins 22. The heat dissipator 18 is attached to the part of the bottom surface of the electric component box 20 located leftward of the partition plate 12. The heat dissipator 18 is provided below the substrate 17. As illustrated in FIG. 1, the heat dissipator 18 is placed rearward of the rear end 29 of the bell mouth 19, that is, at a position closer to the back surface 3 than the rear end 29 of the bell mouth 19. As illustrated in FIG. 2, the heat dissipator 18 is placed above the bell mouth 19. Further, as illustrated in FIGS. 1 and 2, the heat dissipator 18 is placed rightward of the rear end 29 of the bell mouth 19, that is, at a position closer to the compressor 10 than the rear end 29 of the bell mouth 19. FIG. 2 illustrates the compressor 10, the partition plate 12, the substrate 17, the heat dissipator 18, and the electric component box 20 of the constituent elements provided in the housing 1 by the dotted lines.

The heat dissipator 18 includes a base 21 that receives heat generated by the electric components, and the fins 22 arrayed to be spaced apart from each other. The fins 22 serving as a heat dissipation plate are provided on the horizontally placed base 21 and extend downward. FIG. 2 illustrates one of the fins 22 arrayed in the front-rear direction.

Figure 3:
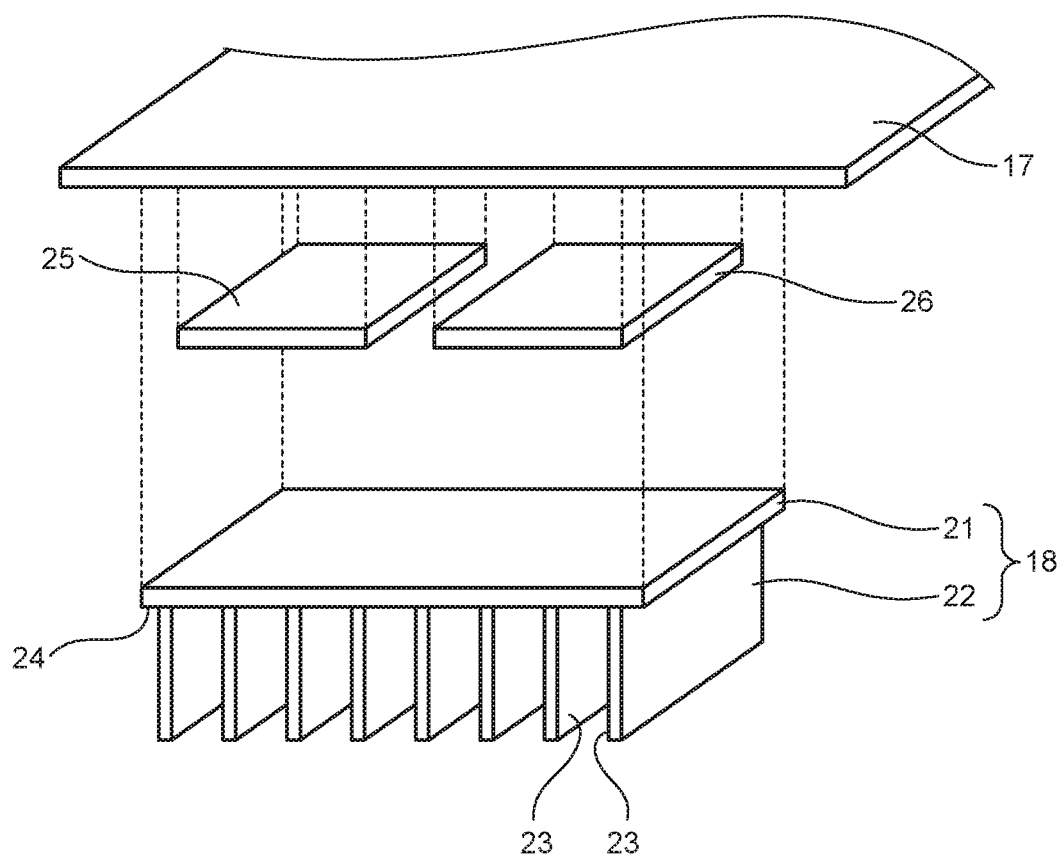
FIG. 3 is a first diagram illustrating a heat dissipator and electric components mounted on a substrate in an internal configuration of the outdoor unit illustrated in FIG. 1.

FIG. 3 is a first diagram illustrating the heat dissipator 18 and the electric components mounted on the substrate 17 in the internal configuration of the outdoor unit 100 illustrated in FIG. 1. FIG. 3 illustrates the heat dissipator 18, a plurality of electric components that are a first electric component 25 and a second electric component 26, and the substrate 17 in an exploded manner. The first electric component 25 and the second electric component 26 are heating elements that require heat dissipation. A bottom surface portion that is a part of the electric component box 20 forming the bottom surface is interposed between the first electric component 25 and the base 21 and between the second electric component 26 and the base 21. FIG. 3 omits illustrations of the bottom surface portion of the electric component box 20.

The base 21 is a plate member having a flat surface 24 with a rectangular shape. The longer side of the rectangular shape of the flat surface 24 is a straight line extending in the front-rear direction. The fin 22 is a plate member provided vertically on the flat surface 24 of the base 21. A heat dissipation surface 23 is the main flat surface for transferring heat to the air among the heat dissipation surfaces constituting the fin 22. The main flat surface for transferring heat to the air is defined as a surface other than the surface with the smallest area among the surfaces of the fin 22. For example, the main flat surface is defined as a surface with the largest area among the surfaces of the fin 22. In the fin 22 with a plate-like shape, the main flat surface for transferring heat to the air is defined as two flat surfaces of the plate that are positioned opposed to, or opposite, each other and that have the largest area among the surfaces of the fin 22. The fins 22 are arrayed such that the heat dissipation surfaces 23 of adjacent fins 22 face each other. Each space between the fins 22 serves as a flow path through which an airflow having received heat from the electric components passes. As a larger amount of airflow passes through the space between the fins 22 and receives heat from the electric components, the outdoor unit 100 can dissipate heat of the electric components more efficiently.

The heat dissipation surface 23 has a rectangular shape with its longer side having a length equal to the shorter side of the flat surface 24 of the base 21. In the following descriptions, the longer-side direction of the heat dissipation surface 23 is sometimes referred to as "longitudinal direction of the fin 22". The longitudinal direction of each of the fins 22 is parallel to the shorter side of the flat surface 24 of the base 21, and is the right-left direction. The heat dissipation surfaces 23 of the fins 22 provided in the heat dissipator 18 are parallel to the back surface 3 of the housing 1.

The first electric component 25 and the second electric component 26 generate a larger amount of heat than other electric components mounted on the substrate 17. The first electric component 25 is a constituent component of an inverter circuit that converts DC power to AC power to drive the compressor 10. The second electric component 26 is a constituent component of a converter circuit that converts AC power to DC power. Each of the first electric component 25 and the second electric component 26 is either a semiconductor element or a reactor. The first electric component 25 and the second electric component 26 are placed in such a manner as to be accommodated within the area of the flat surface 24 of the base 21 in the front-rear direction and the right-left direction. It is allowable that the first electric component 25 and the second electric component 26 are placed such that a part of the first electric component 25 or a part of the second electric component 26 extends over the area of the flat surface 24 of the base 21.

It is allowable to use a wide-bandgap semiconductor such as silicon carbide, gallium nitride, gallium oxide, or diamond in the first electric component 25 and the second electric component 26. In general, a wide-bandgap semiconductor generates a smaller amount of heat than other types of semiconductors. Thus, by using a wide-bandgap semiconductor, the outdoor unit 100 can prevent the first electric component 25 and the second electric component 26 from generating excessive heat.

Heat generated by the first electric component 25 and the second electric component 26 is transferred to the base 21. The heat dissipator 18 transmits the heat having been transferred to the base 21 to the air from the heat dissipation surface 23 of each of the fins 22. It is allowable that an insulating material is interposed between the first electric component 25 and the base 21 and between the second electric component 26 and the base 21.

Along with an airflow, foreign matters such as dust or sand possibly enter the housing 1. In the first embodiment, the substrate 17 is horizontally placed, and thus the fins 22 are provided on the base 21 horizontally placed in the same manner as the substrate 17 such that they extend in the vertical direction. In the outdoor unit 100, the heat dissipation surface 23 of each of the fins 22 is a vertical plane, and this can reduce the accumulation amount of foreign matters on the heat dissipation surface 23 as compared to the case where the heat dissipation surface 23 is a horizontal plane. Due to this configuration, the electric components are mounted on the horizontally placed substrate 17, so that the outdoor unit 100 can reduce a reduction in heat dissipation efficiency caused by the accumulation of foreign matters on the fins 22. The outdoor unit 100 is suitable for use in a dusty or sandy environment.

Assuming that the substrate 17 is vertically placed, the outdoor unit 100 needs to secure a space for avoiding the fins 22 extending in the horizontal direction from interfering with the bell mouth 19 or the blower 9. The outdoor unit 100, in which the substrate 17 is horizontally placed and thus the fins 22 extend in the vertically direction, does not need to secure a space in the right-left direction from the substrate 17. In the outdoor unit 100, the substrate 17 is horizontally placed, so that the substrate 17 and the electric components can be placed in a space provided above the compressor 10. Accordingly, the substrate 17 and the electric components can be placed with less limitations. Due to this placement, the outdoor unit 100 can achieve an internal configuration suitable for downsizing. For this reason, it is suitable to employ the configuration of the outdoor unit 100 in smaller-sized models. It is also allowable to employ the configuration of the outdoor unit 100 in larger-sized models.

Figure 4:
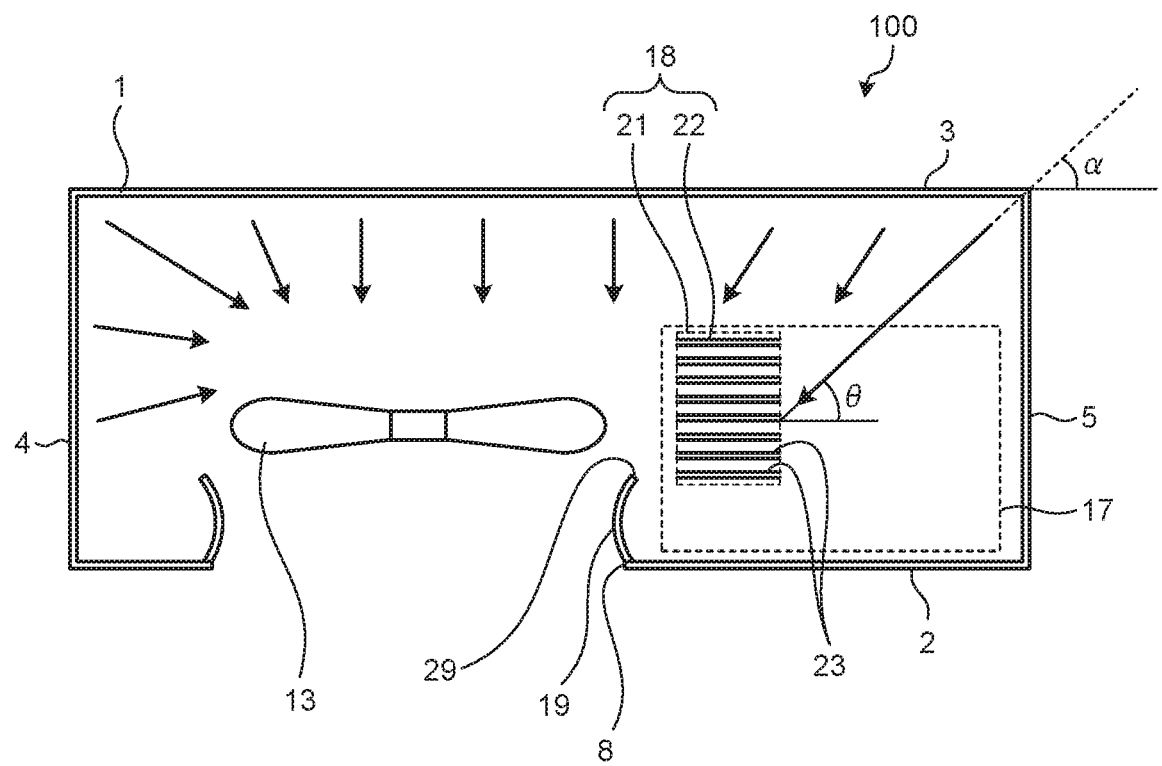
FIG. 4 is an explanatory diagram of a direction of airflow in a housing of the outdoor unit illustrated in FIG. 1.

Next, the relation between the direction of airflow and the orientation of the fins 22 in the heat dissipator 18 is described. FIG. 4 is an explanatory diagram of the direction of airflow in the housing 1 of the outdoor unit 100 illustrated in FIG. 1. FIG. 4 omits illustrations of some of the constituent elements illustrated in FIG. 1. In the substrate 17 and the heat dissipator 18 illustrated in FIG. 1, each of the fins 22 is illustrated by the solid line, while the substrate 17 and the base 21 are illustrated by the dotted lines. The arrows illustrated in FIG. 4 show the directions of airflow.

An airflow is drawn into the housing 1 from the openings in the back surface 3 and the side surface 4 by rotation of the impeller 13, then passes through the heat exchanger 11 illustrated in FIG. 1, and moves toward the outlet 8. Since the impeller 13 and the outlet 8 are placed leftward of the substrate 17, the airflow having passed through the heat exchanger 11 at the rear of the substrate 17 moves in a diagonally forward left direction. The heat dissipator 18 is placed at a position rearward of the rear end 29 of the bell mouth 19 and at a position above and rightward of the bell mouth 19. Accordingly, the airflow moving in a diagonally forward left direction reaches the heat dissipator 18.

An angle α illustrated in FIG. 4 represents an angle of the direction of airflow that reaches the right-side end of the heat dissipator 18 relative to the back surface 3. The angle α is defined as an angle in top view. The case where the angle α is 0 degrees indicates that the direction of airflow is parallel to the back surface 3, which is the right-left direction. The case where the angle α is 90 degrees indicates that the direction of airflow is vertical to the back surface 3, which is the front-rear direction. In a case where the angle α is greater than 0 degrees and less than 90 degrees, the direction of airflow is angled in a diagonally forward left direction. As described above, an airflow moving in a diagonally forward left direction reaches the heat dissipator 18. Accordingly, the angle α is greater than 0 degrees and less than 90 degrees. Further, in the outdoor unit 100 according to the first embodiment, the heat dissipator 18 is placed at a position where the right-left direction component of the airflow that reaches the right-side end of the heat dissipator 18 is greater than the front-rear direction component thereof. The angle α is greater than 0 degrees and less than 45 degrees. Due to rotation of the impeller 13, airflows reach the heat dissipator 18 from various directions. The angle α represents an average direction of the airflows that reach the right-side end of the heat dissipator 18.

In the first embodiment, since the heat dissipation surface 23 is parallel to the back surface 3, an angle θ formed between the heat dissipation surface 23 and the direction of airflow that reaches the right-side end of the heat dissipator 18 is equal to the angle α. As described above, as the angle α is greater than 0 degrees and less than 45 degrees, the angle θ is also greater than 0 degrees and less than 45 degrees.

Figure 5:
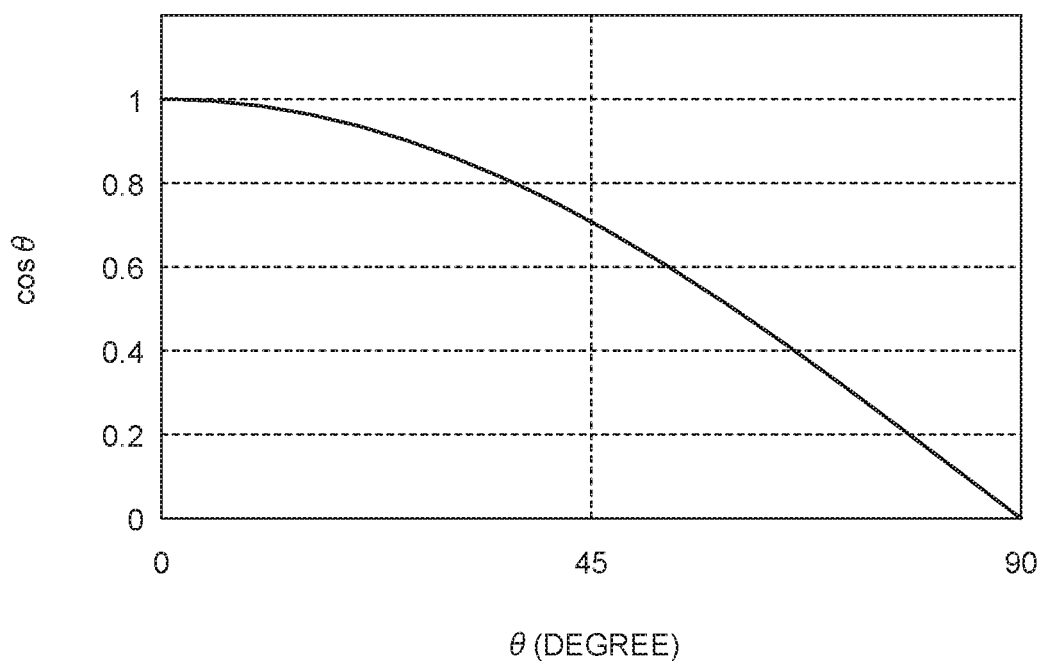
FIG. 5 is an explanatory diagram of a relation between the velocity of airflow passing through a space between fins, and an angle formed between a heat dissipation surface and a direction of airflow that reaches the heat dissipator in the outdoor unit illustrated in FIG. 1.

FIG. 5 is an explanatory diagram of the relation between the velocity of airflow passing through the space between the fins 22, and the angle θ formed between the heat dissipation surface 23 and the direction of airflow that reaches the heat dissipator 18 in the outdoor unit 100 illustrated in FIG. 1. FIG. 5 illustrates a graph in which the horizontal axis represents the angle 19, while the vertical axis represents cos θ. In the following descriptions, the direction of airflow that reaches the heat dissipator 18 is assumed to be constant, and the velocity of airflow passing through the space between the fins 22 is assumed to be proportional to cos θ. As the angle θ becomes closer to 0 degrees, the velocity of airflow becomes faster. As the angle θ becomes closer to 90 degrees, the velocity of airflow becomes slower.

In FIG. 5, when the angle θ is equal to or greater than 0 degrees and less than 45 degrees, cos θ decreases more moderately relative to an increase in the angle θ than the case where the angle θ is equal to or greater than 45 degrees and equal to or less than 90 degrees. The angle θ is set to be less than 45 degrees and thereby the outdoor unit 100 can reduce a reduction in the velocity of airflow passing through the space between the fins 22, and is capable of dissipating heat of the electric components efficiently.

Assuming that the longitudinal direction of the fins 22 corresponds to the front-rear direction that is parallel to the longer side of the rectangular shape of the base 21, the heat dissipation surface 23 of each of the fins 22 is vertical to the back surface 3. In this case, the angle θ formed between the heat dissipation surface 23 and the direction of airflow, that is the angle α, is greater than 45 degrees. Accordingly, a larger amount of airflow hits the heat dissipation surface 23 than the case where the heat dissipation surface 23 of each of the fins 22 is parallel to the back surface 3. As a larger amount of airflow hits the heat dissipation surfaces 23, a smaller amount of airflow passes through the space between the fins 22 along each of the heat dissipation surfaces 23. This makes it difficult to efficiently dissipate heat of the electric components. The outdoor unit 100, in which the heat dissipation surface 23 of each of the fins 22 is parallel to the back surface 3, is capable of dissipating heat of the electric components more efficiently than the case where the heat dissipation surface 23 of each of the fins 22 is vertical to the back surface 3.

In an airflow that reaches the heat dissipator 18, a component in a direction parallel to the back surface 3 is greater than a component in a direction vertical to the back surface 3. Accordingly, in a case where the heat dissipation surface 23 is parallel to the back surface 3, the amount of airflow that flows away from the flow path that is the space between the fins 22 and then flows toward the outlet 8 is reduced as compared to the case where the heat dissipation surface 23 is vertical to the back surface 3. Because the amount of airflow that flows away from the flow path of the heat dissipator 18 is reduced, the outdoor unit 100 is capable of dissipating heat of the electric components efficiently.

In the first embodiment, the longitudinal direction of the fins 22 is parallel to the shorter side of the rectangular shape of the base 21. Consequently, the flow path of the heat dissipator 18 is shorter than that in the case where the longitudinal direction of the fins 22 is parallel to the longer side of the rectangular shape of the base 21. The length of the flow path is smaller than the length of the longer side of the base 21. As the flow path of the heat dissipator 18 is shorter, the outdoor unit 100 can further reduce a reduction in the velocity of airflow caused by friction between the heat dissipation surface 23 and the airflow.

In a case where the heat dissipation surface 23 of each of the fins 22 is vertical to the back surface 3, the airflow moving toward the front along the heat dissipation surface 23 hits the part of the inner surface of the housing 1 located rightward of the bell mouth 19. Consequently, stagnation of air with heat having been transferred from the fins 22 is more likely to occur. The heat dissipation surface 23 of each of the fins 22 is parallel to the back surface 3, so that an airflow moves leftward along the heat dissipation surface 23, then moves toward the outlet 8, and is discharged to the outside of the housing 1. The outdoor unit 100 facilitates discharge of the air with heat having been transferred from the fins 22, and is thus capable of efficiently dissipating heat through the heat dissipator 18. Further, in the outdoor unit 100, the heat dissipator 18 is placed rearward of the rear end 29 of the bell mouth 19. Accordingly, the outdoor unit 100 can further reduce the amount of air stagnating on the right side of the bell mouth 19, and thus can efficiently move the airflow having passed through the heat dissipator 18 toward the outlet 8. The outdoor unit 100 is capable of efficiently dissipating heat through the heat dissipator 18, and is thus suitable for use in a high-temperature environment.

As described above, the outdoor unit 100 can reduce a reduction in the velocity of airflow passing through the space between the fins 22, and is thus capable of reducing the adhesion of foreign matters flowing with the airflow to the heat dissipation surface 23. The outdoor unit 100 can reduce a reduction in heat dissipation efficiency caused by the accumulation of foreign matters on the fins 22. The outdoor unit 100 is capable of reducing the amount of air stagnating in the housing 1, and can thereby reduce the accumulation amount of foreign matters flowing with the airflow in the housing 1. The outdoor unit 100 is suitable for use in a dusty or sandy environment.

It is allowable that the outdoor unit 100 is configured to have the heat dissipator 18 placed above the substrate 17, instead of the configuration described above in which the heat dissipator 18 is placed below the substrate 17. In a case where the heat dissipator 18 is placed above the substrate 17, the fins 22 are provided on the base 21 and extend upward. Even when the heat dissipator 18 is placed above the substrate 17, an airflow flows in the same manner as the above case. Accordingly, the outdoor unit 100 can efficiently dissipate heat of the electric components and can reduce the accumulation amount of foreign matters.

Figure 6:
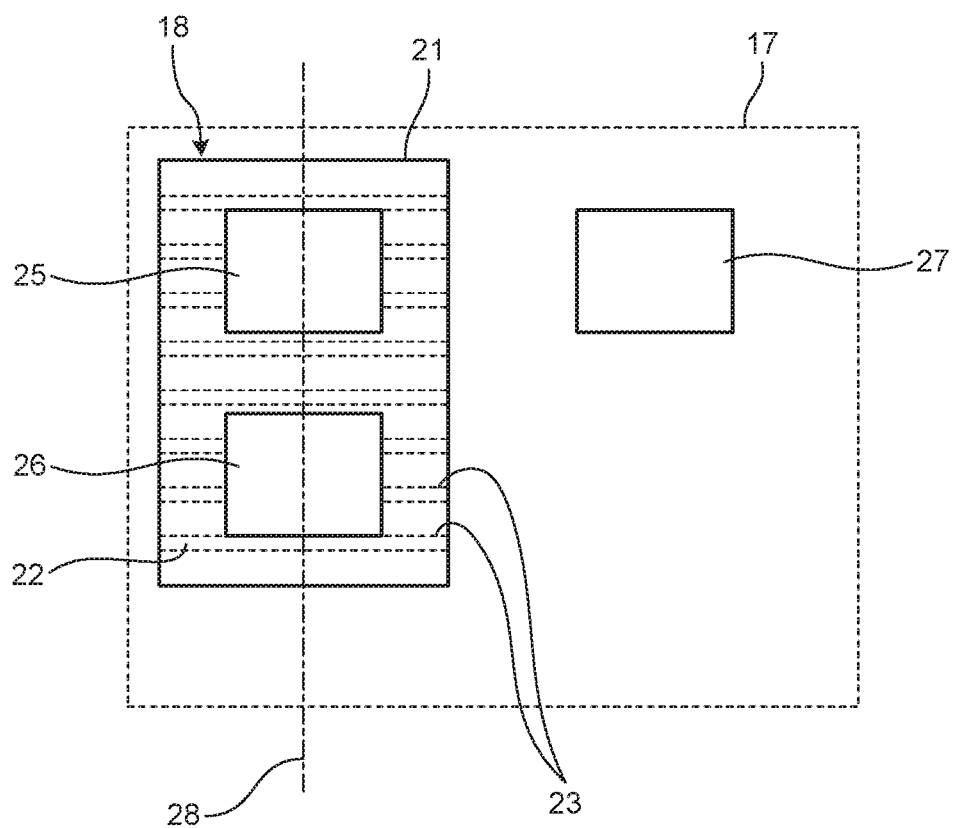
FIG. 6 is a second diagram illustrating the heat dissipator and the electric components mounted on the substrate in the internal configuration of the outdoor unit illustrated in FIG. 1.

FIG. 6 is a second diagram illustrating the heat dissipator 18 and the electric components mounted on the substrate 17 in the internal configuration of the outdoor unit 100 illustrated in FIG. 1. FIG. 6 illustrates the heat dissipator 18 and the electric components mounted on the substrate 17 when viewed from the top. FIG. 6 illustrates the substrate 17 and the fins 22 by the dotted lines.

A third electric component 27 is one of the electric components mounted on the substrate 17 and is other than the first electric component 25 and the second electric component 26. The third electric component 27 is a constituent component of an inverter circuit that converts DC power to AC power to drive the fan motor 14. The third electric component 27 is either a semiconductor element or a reactor. It is allowable that on the substrate 17, an electric component other than the first electric component 25, the second electric component 26, and the third electric component 27 is mounted.

FIG. 6 illustrates the direction in which the first electric component 25 and the second electric component 26 are arrayed by a center line 28. The center line 28 is a straight line connecting the center position of the first electric component 25 in the right-left direction and the center position of the second electric component 26 in the right-left direction. The center line 28 extends in the front-rear direction and is vertical to the heat dissipation surface 23. The direction in which the first electric component 25 and the second electric component 26 are arrayed is vertical to the heat dissipation surface 23. The angle of 90 degrees is formed between the direction of airflow passing through the flow path and the direction in which the first electric component 25 and the second electric component 26 are arrayed. An airflow in a direction vertical to the direction in which the first electric component 25 and the second electric component 26 are arrayed flows through the heat dissipator 18. An airflow that receives heat from the first electric component 25 and an airflow that receives heat from the second electric component 26 pass through different flow paths from each other in the heat dissipator 18.

Assuming that the center line 28 is parallel to the direction of the heat dissipation surface 23, an airflow that receives heat from the first electric component 25 and an airflow that receives heat from the second electric component 26 both pass through a common flow path in the heat dissipator 18. In this case, the airflow having received heat from the first electric component 25 is used to dissipate heat of the second electric component 26. This makes it difficult to efficiently dissipate heat of the second electric component 26. According to the first embodiment, the outdoor unit 100 is capable of dissipating heat of both the first electric component 25 and the second electric component 26 more efficiently than the case where the direction of the center line 28 aligns with the direction of airflow.

According to the first embodiment, the outdoor unit 100, in which the heat dissipation surfaces 23 of the fins 22 are parallel to the back surface 3 of the housing 1, can reduce a reduction in the velocity of airflow passing through the space between the fins 22. Due to this configuration, the outdoor unit 100 has an effect where it is possible to achieve improvement in heat dissipation efficiency for heat generated by an electric component provided in a housing 1.

Second Embodiment

Figure 7:
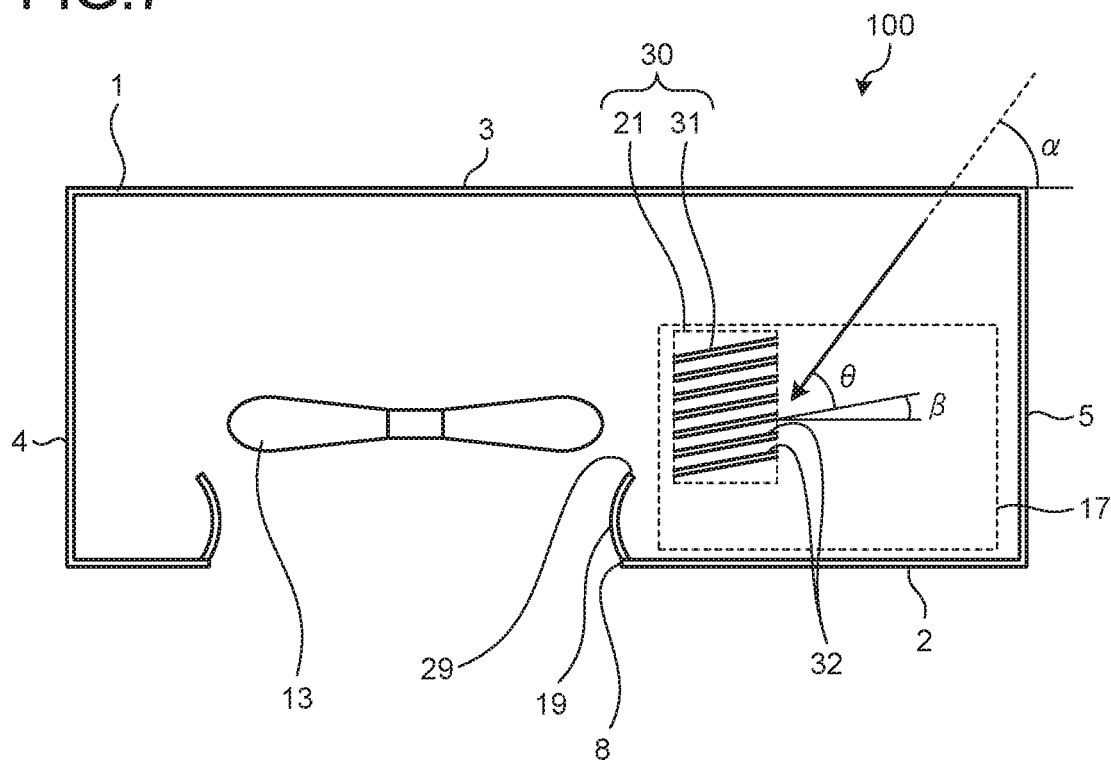
FIG. 7 is a diagram illustrating a configuration of an outdoor unit according to a second embodiment of the present invention.

FIG. 7 is a diagram illustrating a configuration of the outdoor unit 100 according to a second embodiment of the present invention. In contrast to the outdoor unit 100 according to the first embodiment in which the heat dissipation surface 23 is parallel to the back surface 3, a heat dissipation surface 32 in the outdoor unit 100 according to the second embodiment is angled at greater than 0 degrees and less than 90 degrees relative to the back surface 3 in top view. In the second embodiment, constituent elements identical to those of the first embodiment are denoted by like reference signs and descriptions overlapping with those of the first embodiment will be omitted. FIG. 7 omits illustrations of a part of constituent elements identical to those illustrated in FIG. 1.

A heat dissipator 30 is a heat sink including a plurality of fins 31. The heat dissipator 30 is placed at the same position as the heat dissipator 18 according to the first embodiment. The fin 31 is a plate member provided vertically on the flat surface 24 of the base 21 similarly to the fin 22 illustrated in FIG. 3. The heat dissipation surface 32 is the main flat surface for transferring heat to the air among the heat dissipation surfaces constituting the fin 31. The heat dissipation surface 32 is defined as two flat surfaces of the plate that are positioned opposed to, or opposite, each other and that have the largest area among the surfaces of the fin 31. The fins 31 are arrayed such that the heat dissipation surfaces 32 of adjacent fins 31 face each other. In the substrate 17 and the heat dissipator 30 illustrated in FIG. 7, each of the fins 31 is illustrated by the solid line, while the substrate 17 and the base 21 are illustrated by the dotted lines.

The heat dissipation surface 32 has a rectangular shape with its longer side having a length greater than the shorter side of the rectangular shape of the flat surface 24 of the base 21. In the following descriptions, the longer-side direction of the heat dissipation surface 32 is sometimes referred to as "longitudinal direction of the fin 31". The longitudinal direction of each of the fins 31 is angled relative to the shorter side of the flat surface 24 of the base 21, while being angled relative to the right-left direction. On the flat surface 24, the fins 31 are provided in such a manner that the heat dissipation surfaces 32 are angled relative to the shorter side of the rectangular shape without crossing the shorter side. In the second embodiment, the flow path of the heat dissipator 30 is shorter than that in the case where the longitudinal direction of the fin 31 is parallel to the longer side of the base 21. The length of the flow path is smaller than the length of the longer side of the base 21. As the flow path of the heat dissipator 30 is shorter, the outdoor unit 100 can further reduce a reduction in the velocity of airflow caused by friction between the heat dissipation surface 32 and the airflow.

The longitudinal direction of the fin 31 is angled at an angle β relative to the shorter side of the flat surface 24 of the base 21. The angle β is defined as an angle in top view. The heat dissipation surfaces 32 of the fins 31 provided in the heat dissipator 30 are angled at the angle β relative to the back surface 3. A case where the angle β is 0 degrees indicates that the heat dissipation surfaces 32 are parallel to the back surface 3 similarly to the first embodiment. A case where the angle β is 90 degrees indicates that the heat dissipation surfaces 32 are vertical to the back surface 3 and parallel to the front-rear direction. In a case where the angle β is greater than 0 degrees and less than 90 degrees, the left portions of the heat dissipation surfaces 32 are inclined forward. Similarly to the heat dissipator 18 according to the first embodiment, the heat dissipator 30 is placed at a position where the right-left direction component of the airflow that reaches the right-side end of the heat dissipator 30 is greater than the front-rear direction component thereof. The angle α is greater than 0 degrees and less than 45 degrees.

Next, the relation between the direction of airflow and the orientation of the fins 31 in the heat dissipator 30 is described. In the outdoor unit 100 according to the second embodiment, an airflow moving in a direction at the angle α relative to the back surface 3 reaches the right-side end of the heat dissipator 30 similarly to the first embodiment. In the second embodiment, the heat dissipation surface 32 is angled at the angle β relative to the back surface 3. Accordingly, the angle θ formed between the heat dissipation surface 32 and the direction of airflow that reaches the right-side end of the heat dissipator 30 is equal to the difference obtained by subtracting the angle β from the angle α. The angle θ satisfies the relation expressed as "θ=α−β".

In a case where the angle β is equal to the angle α, that is, when the angle θ is 0 degrees, the direction of airflow that reaches the heat dissipator 30 is parallel to the heat dissipation surface 32. As the direction of the heat dissipation surface 32 is closer to the direction of airflow, the heat dissipation efficiency in the heat dissipator 30 improves. While the angle α is greater than 0 degrees and less than 45 degrees, the angle β is set greater than 0 degrees and less than 90 degrees, so that the variation range of the angle θ can be set less than 45 degrees at which it is possible to efficiently dissipate heat of the electric components, similarly to the first embodiment. Due to this setting, the outdoor unit 100 can efficiently dissipate heat of the electric components.

In the second embodiment, the angle formed between the center line 28 illustrated in FIG. 6 and the heat dissipation surface 32 is greater than 0 degrees and less than 90 degrees. The heat dissipation surface 32 is angled relative to the direction in which the first electric component 25 and the second electric component 26 are arrayed. The angle of greater than 0 degrees and less than 90 degrees is formed between the direction of airflow passing through the flow path and the direction in which the first electric component 25 and the second electric component 26 are arrayed. In the second embodiment, the angle β is set such that an airflow passing below the first electric component 25 and an airflow passing below the second electric component 26 pass through different flow paths from each other in the heat dissipator 30. Due to this setting, the outdoor unit 100 is capable of efficiently dissipating heat of both the first electric component 25 and the second electric component 26.

When the angle β is greater than 0 degrees and less than 45 degrees, the outdoor unit 100 can move an airflow angled at the angle α that is greater than 0 degrees and less than 45 degrees efficiently through the flow path of the heat dissipator 30. Due to this configuration, the outdoor unit 100 can further efficiently dissipate heat of the electric components.

In the second embodiment, the outdoor unit 100, in which the heat dissipation surfaces 32 of the fins 31 are angled at greater than 0 degrees and less than 90 degrees relative to the back surface 3, can reduce a reduction in the velocity of airflow passing through the space between the fins 31. Due to this configuration, the outdoor unit 100 can achieve the effect of improving the efficiency in dissipating heat generated by the electric components provided in the housing 1.

Third Embodiment

Figure 8:
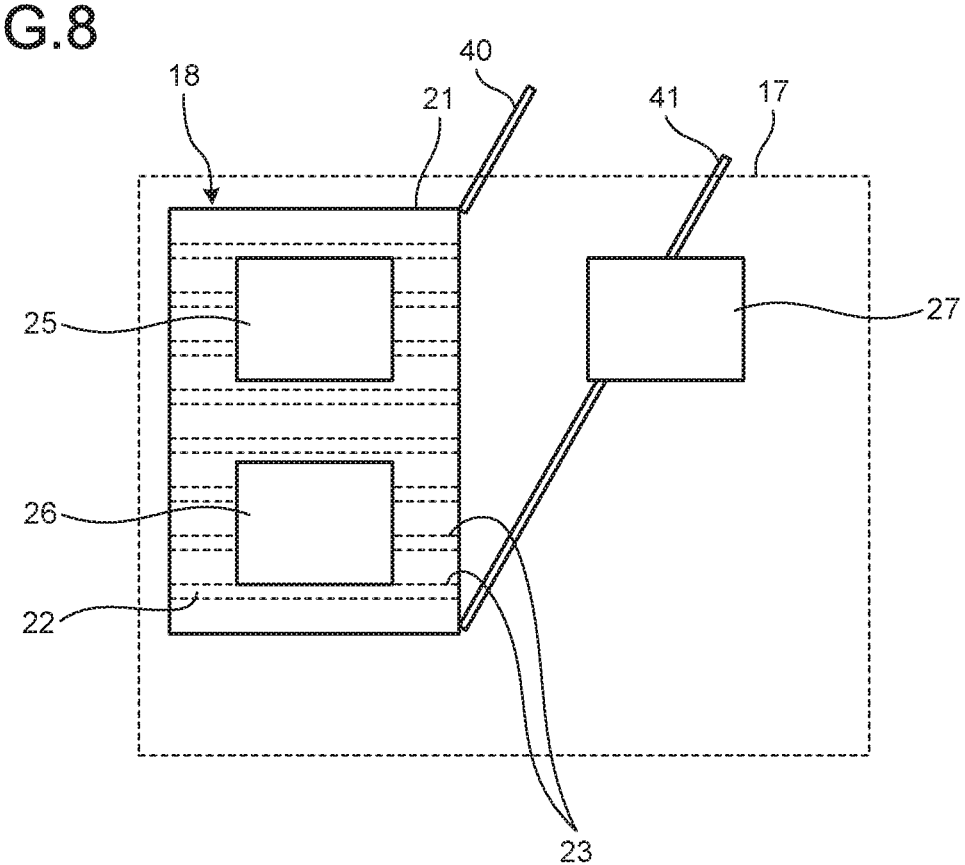
FIG. 8 is a diagram illustrating a configuration of relevant parts of an outdoor unit according to a third embodiment of the present invention.

FIG. 8 is a diagram illustrating a configuration of relevant parts of the outdoor unit 100 according to a third embodiment of the present invention. The outdoor unit 100 according to the third embodiment includes an airflow direction adjuster that adjusts the direction of airflow toward the heat dissipator 18. In the third embodiment, constituent elements identical to those of the first and second embodiments are denoted by like reference signs and descriptions overlapping with those of the first and second embodiments will be omitted.

The outdoor unit 100 according to the third embodiment is obtained by adding the airflow direction adjuster to the outdoor unit 100 according to the first embodiment. FIG. 8 illustrates the heat dissipator 18 and the electric components mounted on the substrate 17 when viewed from the top. FIG. 8 illustrates the substrate 17 and the fins 22 by the dotted lines. It is allowable that the airflow direction adjuster according to the third embodiment is provided in the outdoor unit 100 according to the second embodiment.

Airflow direction adjusting plates 40 and 41 serving as the airflow direction adjuster are provided to extend from the base 21 diagonally rearward and to the right. The airflow direction adjusting plate 40 extends diagonally rearward and to the right from the right-rear corner of the base 21. The airflow direction adjusting plate 41 extends diagonally rearward and to the right from the right-front corner of the base 21. Constituent elements such as cables or other components are placed outside a region surrounded by the two airflow direction adjusting plates 40 and 41 and the base 21. The constituent elements that interfere with airflow movement are placed outside the region, so that the outdoor unit 100 can efficiently move the airflow to the heat dissipator 18.

When an airflow moves from the heat exchanger 11 toward the space between the two airflow direction adjusting plates 40 and 41, the direction of the airflow is adjusted by the airflow direction adjusting plates 40 and 41, and then this airflow is collected at the heat dissipator 18. The outdoor unit 100 allows a larger amount of airflow to move to the heat dissipator 18, and thus can dissipate heat of the electric components efficiently. The positions and shapes of the airflow direction adjusting plates 40 and 41 are not limited to those illustrated in FIG. 8, and can be appropriately changed. It is allowable that only one airflow direction adjusting plate is provided to serve as the air direction adjuster, or more than two airflow direction adjusting plates are provided to serve as the air direction adjuster.

The configurations described in the above embodiments are only examples of the content of the present invention.

The configurations can be combined with other well-known techniques, and part of each of the configurations can be omitted or modified without departing from the scope of the present invention.

REFERENCE SIGNS LIST

1 housing, 2 front surface, 3 back surface, 4 side surface, 6 bottom surface, 7 top surface, 8 outlet, 9 blower, 10 compressor, 11 heat exchanger, 12 partition plate, 13 impeller, 14 fan motor, 15 blower chamber, 16 compressor chamber, 17 substrate, 18, 30 heat dissipator, 19 bell mouth, 20 electric component box, base, 22, 31 fin, 23, 32 heat dissipation surface, 24 flat surface, 25 first electric component, 26 second electric component, 27 third electric component, 28 center line, 29 rear end, 40, 41 airflow direction adjusting plate, 100 outdoor unit.

The invention claimed is:

1. An outdoor unit comprising:
   a housing having a front surface formed with an outlet and a back surface facing the front surface, an airflow flowing through the outlet;
   a heat exchanger provided along the back surface in the housing;
   a blower provided in the housing, the blower causing air drawn from outside of the housing and passing through the heat exchanger to flow toward the outlet;
   a compressor provided in the housing;
   a partition plate partitioning an interior of the housing into a compressor chamber in which the compressor is accommodated and a blower chamber in which the blower and the heat exchanger are accommodated;
   a substrate horizontally placed in the housing, a plurality of electric components including a heating electric component being mounted on the substrate;
   an electric component box accommodating the substrate, one part of an undersurface of the electric component box being in contact with the partition plate; and
   a heat dissipator provided in the blower chamber, the heat dissipator dissipating, due to the airflow, heat generated by the heating electric component, wherein
   the heat dissipator is provided on the undersurface of the electric component box and in the blower chamber, the heat dissipator being separated from a side surface of the partition plate,
   the heat dissipator comprises
      a base provided on the undersurface of the electric component box and in the blower chamber, the heat dissipator being separated from a side surface of the partition plate; and
      a plurality of fins, each of the fins having a heat dissipation surface, the heat dissipation surface of each of the fins is parallel to the back surface or is angled at greater than 0 degrees and less than 90 degrees relative to the back surface in top view, and
   the heating electric component is placed in such a manner as to be accommodated within an area of a flat surface of the base.

2. The outdoor unit according to claim 1, wherein
   the base has a rectangular surface, the fins being provided on the base,
   a flow path is formed between the fins, an airflow passing through the flow path, and
   a length of the flow path is smaller than a length of a longer side of the base.

3. The outdoor unit according to claim 1, wherein
   an angle is formed between a direction in which the electric components are arrayed and a direction of airflow passing through a flow path formed between the fins.

4. The outdoor unit according to claim 1, further comprising a bell mouth provided so as to protrude from a peripheral edge of the outlet into an interior of the housing, the bell mouth including an end portion protruding into an interior of the housing, wherein
   the heat dissipator is placed at a position closer to the back surface than the end portion of the bell mouth.

5. The outdoor unit according to claim 1, further comprising an airflow direction adjuster adjusting a direction of airflow toward the heat dissipator.

6. The outdoor unit according to claim 1, wherein a wide-bandgap semiconductor is used for the electric component.

* * * * *